United States Patent
Chen et al.

(10) Patent No.: US 8,279,014 B2
(45) Date of Patent: Oct. 2, 2012

(54) FREQUENCY SYNTHESIZER WITH BUILT-IN CARRIER AND CRYSTAL OSCILLATION FREQUENCY OFFSET CANCELLATION

(75) Inventors: Chun-Chin Chen, Taoyuan (TW); Yun-Hsueh Chuang, Taoyuan (TW); Yi-Chun Lu, Pingzhen (TW)

(73) Assignee: Uniband Electronic Corp., Hsinchu (TW)

( * ) Notice: Subject to any disclaimer, the term of this patent is extended or adjusted under 35 U.S.C. 154(b) by 49 days.

(21) Appl. No.: 12/986,372

(22) Filed: Jan. 7, 2011

(65) Prior Publication Data

US 2012/0176202 A1    Jul. 12, 2012

(51) Int. Cl.
*H03L 7/08* (2006.01)
*H04B 15/00* (2006.01)

(52) U.S. Cl. .......... 331/34; 332/127; 327/156; 455/501; 455/119

(58) Field of Classification Search .......... 331/1 R, 331/18, 34, 44, 172, 175; 332/127; 327/156; 455/501, 502, 119; 342/450, 453, 463–465
See application file for complete search history.

(56) References Cited

U.S. PATENT DOCUMENTS

| 6,856,791 B2 * | 2/2005 | Klemmer ............... 455/76 |
| 6,876,874 B2 * | 4/2005 | Arnaud et al. ............ 455/574 |
| 8,004,322 B2 * | 8/2011 | Neumann ................ 327/156 |

* cited by examiner

*Primary Examiner* — Ryan Johnson
(74) *Attorney, Agent, or Firm* — Thomas, Kayden, Horstemeyer & Risley, LLP

(57) ABSTRACT

A frequency synthesizer of a transceiver for generating a crystal oscillation frequency and a carry frequency having been done a process of frequency offset cancellation with that of another transceiver. The frequency offset cancellation of the frequency synthesizer is done in accordance with a wireless signal which is transmitted from another transceiver received. The frequency synthesizer has a first sigma-delta modulator receiving a signal transmitted by a transceiver at far area responding thereafter a frequency divisor value in accordance with the channel information of the received signal and a frequency offset between two.

6 Claims, 4 Drawing Sheets

FREQUENCY SYNTHESIZER WITH BUILT-IN CARRIER AND CRYSTAL OSCILLATION FREQUENCY OFFSET CANCELLATION

FIELD OF THE INVENTION

The present invention pertains to a frequency synthesizer, particularly to a frequency synthesizer of a first transceiver at local generating a crystal oscillation signal and a carrier signal whose frequencies have been calibrated by tracing a BPSK modulated signal received, which is transmitted from a second transceiver at a distant location.

BACKGROUND OF THE INVENTION

With the development of wireless communication, can be widely applied on many fields and provide potential business market opportunities thus it is always a hot topic, for example, the global satellite position, back car radar, directional car search, people searching, or object searching etc. The positioning technique is particularly useful for the team tours in mountain if every team member tied with or bring a transceiver. One of positioning techniques may refer to the RSSI (received signal strength indicator) to derive the distance of the object or people. The RSSI position technique involves using the RFID and the antennas. To position an object in a positioning space, four antennas are demanded or in a 2D plane by three antennas. FIG. 1A, a schematic diagram, depicts the 2D planar positioning. Three antenna readers are assumed placed at positions A, B, C and a target to be positioned is assumed at the point P. If the target has a transmitter to transmit a wireless signal then the antenna readers A, B, and C would receive the signal thereby the distances $d_p^A$, $d_p^B$, $d_p^C$ can be estimated according to the RSSI values detected. Accordingly, the coordinate of the P can be obtained by solving the coupling equations:

$$d_p^A = \sqrt{(x_A-x_P)^2+(y_A-y_P)^2} \quad (1)$$

$$d_p^A = \sqrt{(x_B-x_P)^2+(y_B-y_P)^2} \quad (2)$$

$$d_p^C = \sqrt{(x_C-x_P)^2+(y_C-y_P)^2} \quad (3)$$

However, the RSSI values are vulnerable to be affected by environmental factors unless the RSSI values have been passed a long training time and/or correctness thereafter.

Another positioning method of the radio signal positioning is by time arriving, which is found to be more precisely and less be affected by environment than RSSI. Please refer to FIG. 1B, a first signal is sent out at position A by a first transceiver, which cost a duration $t_{dur}$. Upon receiving the first signal by the second transceiver at time $t_B$ at the position B, the second transceiver transmits a second signal back immediately and received by the first transceiver at time $t_A$.

The distance $d_{AB}$ between position A and position B can be expressed as:

$$d_{AB} = \frac{t_A - t_B}{2} \times C$$

where $C$ is the velocity of light

In practice, both of the wireless signals are modulated signals transmitted according to a data packet protocol, which are a baseband signal modulated by a carrier signal. After the modulated signal received by the transceiver, the modulated signal is demodulated to return to the baseband signal. To position by using a wireless signal technique, the crystal oscillation frequencies of the first transceiver and the second transceiver should be in consistence; otherwise, the arrival time would be incorrect.

Unfortunately, even using the most advanced semiconductor processes, two crystal oscillators are generally found to have a frequency offset. The frequency offset is usually negligible, e.g. one or several ppm. (parts per million). However, the distance error caused by the frequency offset will be not negligible but significantly due to the value that the frequency offset times velocity of light is not negligible. Thus if there is any frequency offset, it will be inferior to use in positioning.

Consequently, it is important to know the frequency offset between two oscillation frequencies and further cancel them before using them in frequency synthesizer to generate a carrier signal.

A conventional but exemplary frequency synthesizer is disclosed by an U.S. Pat. No. 7,649,428 having a title "Method and System for Generating Noise in a Frequency Synthesizer." The patent is to generate a noise portion of an input signal within the frequency synthesizer and appending the noise portion the noise portion to a control portion of the input signal. The functional blocks diagram, please see the FIG. 1C. The frequency synthesizer is a fractional-N synthesizer with a PLL (phase locked loop) 20, a sigma delta modulator 32, and a mixer 34. The phase locked loop 20 includes a phase frequency detector (PFD) 22, a charge pump 24, a loop filter 26, a voltage-controlled oscillator 28, a multi-modulus divider 30 in series connected to compose a loop. The output signal Fout of the VCO 28 is fed back to the multi-modulus divider 30 and the latter then outputs a signal and is compared with an input signal FIN by the phase detector 22.

The sigma-delta modulator 32 outputs a fractional part Δ[K], which is then summed with an integer N by a summer 34. Accordingly, the summer 34 provides a fractional integer, represented by "N.Δ[K]" as a divisor to the multi-modulus divider 30. As a result, the frequency Ferr is equal to Fout divided by (N.Δ[K]).

The frequency Ferr is then compared with the FIN of the input signal of the PLL circuit 20. If the phase difference between two input signals Ferr, FIN of the PFD 22 is over ±2π then the PFD 22 is operated in the frequency detect mode, then the charge pump 24 operated is in full speed, i.e., running a constant current. The full speed operating process of the charging pump 24 is continuously until the phase difference between two input signal drops within ±2π.

The PFD is thus running into a phase detect mode. The output of the charge pump 24 is proportional to the phase difference. Once the phase difference of two signals reaches zero. The device enters into the phase locked state.

The prior art doesn't relate to a method of correcting the frequency offset between two transceivers at two locations.

An object of the present invention thus provides a frequency synthesizer having frequencies outputted tracing the signal received so that the frequency offset of two frequency synthesizers of the transceivers can be cancelled.

SUMMARY OF THE INVENTION

The present invention discloses a frequency synthesizer of a transceiver for generating a crystal oscillation frequency and a carry frequency having frequency offset cancellation with that of another transceiver.

The frequency synthesizer comprises a phase frequency detector, a charge pump, a loop filter, a voltage-controlled oscillator (VCO), a first multi-modulus divider, and a first sigma-data (Σ-Δ) modulator connected to compose a phase locked loop. In addition to the phase locked loop (PLL), the frequency synthesizer further comprises a second multi-modulus divider, a second Σ-Δ modulator; and a frequency offset estimation unit.

The frequency offset estimation unit provides the information of the frequency offset between the two frequency synthesizers The first Σ-Δ modulator generates a divisor according to the channel information of the first signal received according to a look-up table and further provides a calibrated divisor for the first multi-modulus divider according to the data about frequency offset.

After the PLL entered the phase locked state, the frequency synthesizer outputs a calibrated frequency for a carrier signal. The second Σ-Δ modulator provides a divisor to the second multi-modulus divider in accordance with the channel information of the first signal received. The second multi-modulus divider then generates a calibrated crystal oscillation frequency by using the calibrated carrier frequency outputted from the VCO as dividend divided by the divisor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

As mentioned above, if two frequencies of crystal oscillators of two transceivers do not the same i.e. they exist a frequency offset, then, it will result in positioning errors, and the errors is increased with the frequency deviation.

The reason is obvious because once the frequencies of synthesizers use such crystal oscillators to generate UHF (UHV) carrier signals, the frequency inconsistent will be further amplified by them.

The present invention is to solve forgoing problems. The frequency synthesizer generates a calibrated crystal oscillation frequency and a calibrated carrier frequency. Described hereinafter the "calibrated" means the carry frequency of the local transceiver based on the crystal oscillation frequency, which has traced the wireless signal received. That is, frequency offset between two transceivers has been cancelled.

In other words, the local frequency synthesizer of the local transceiver will refer the signal received from the distant transceiver so that the crystal frequencies of two transceivers are in consistence.

Figure 1A:
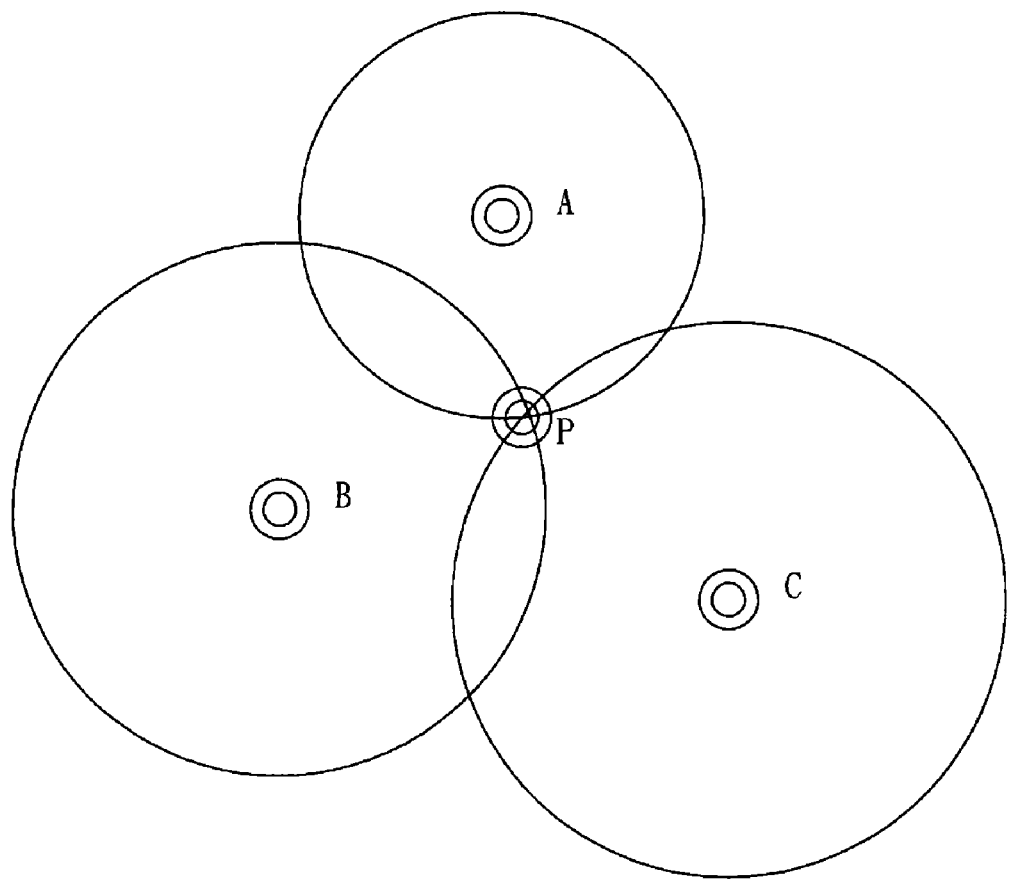
FIG. 1A shows three antenna to position a target in accordance with the prior art.
Figure 1B:
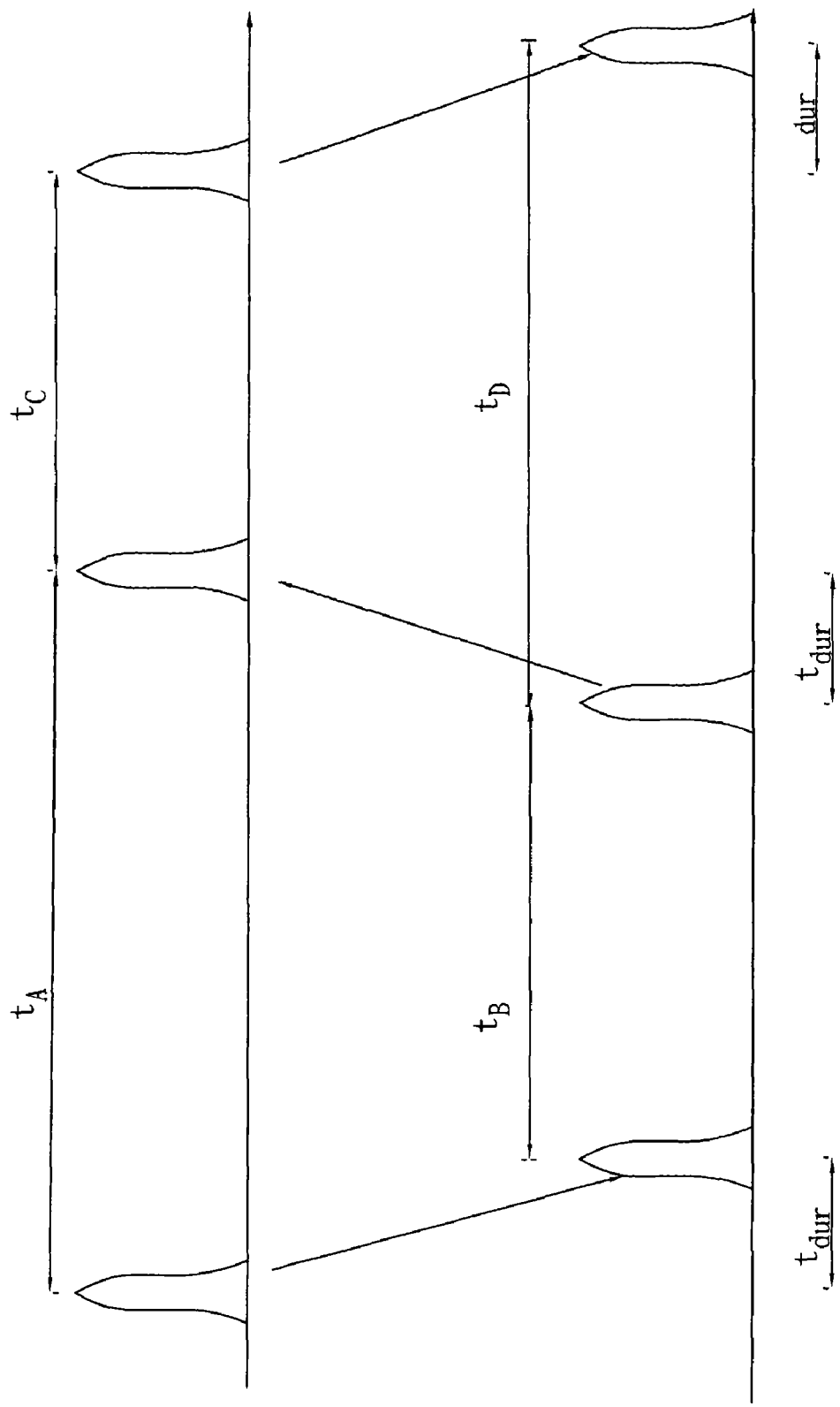
FIG. 1B shows a positioning method using time arrived in accordance with the prior art.
Figure 1C:
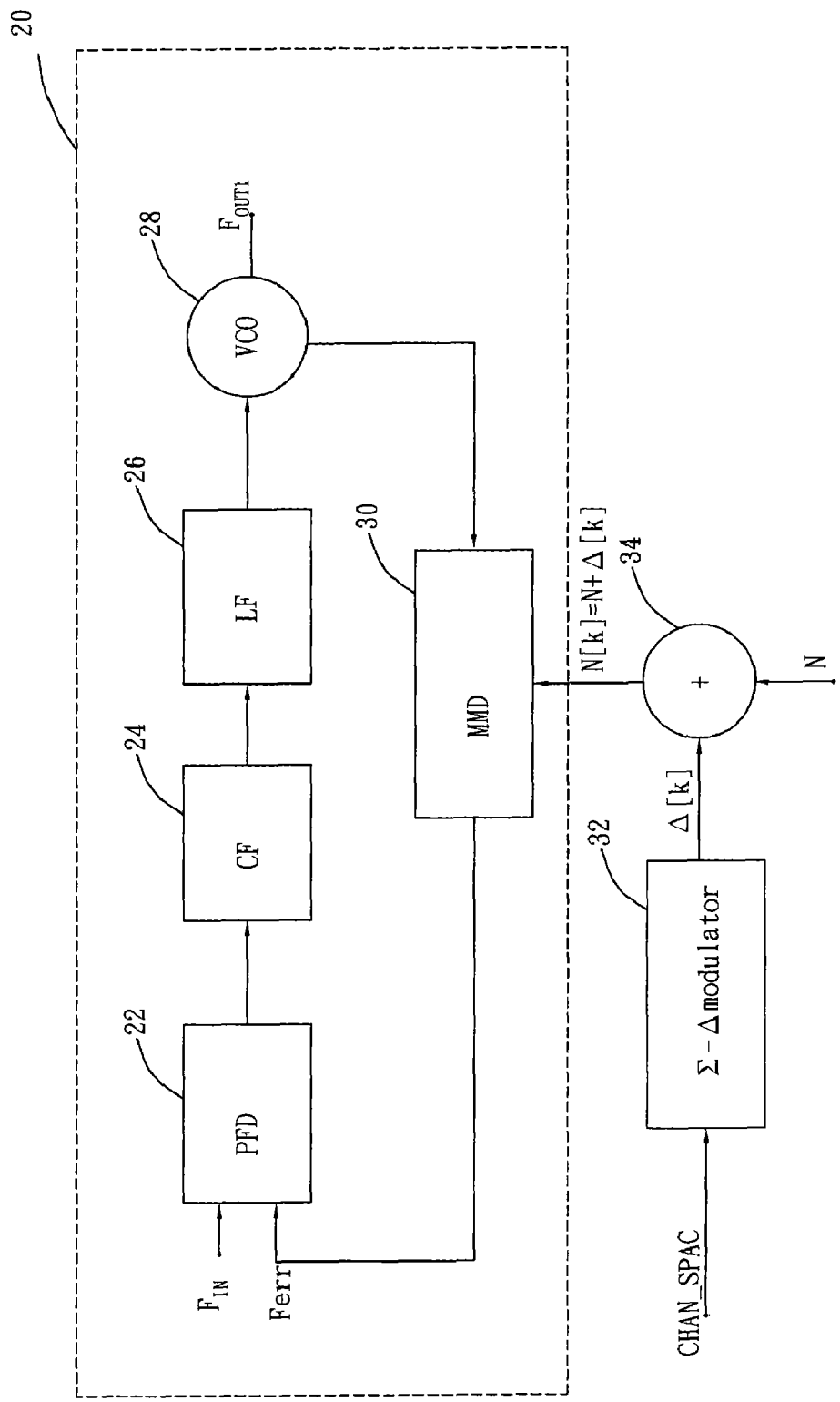
FIG. 1C shows a block diagram of a frequency synthesizer in accordance with the prior art.
Figure 2:
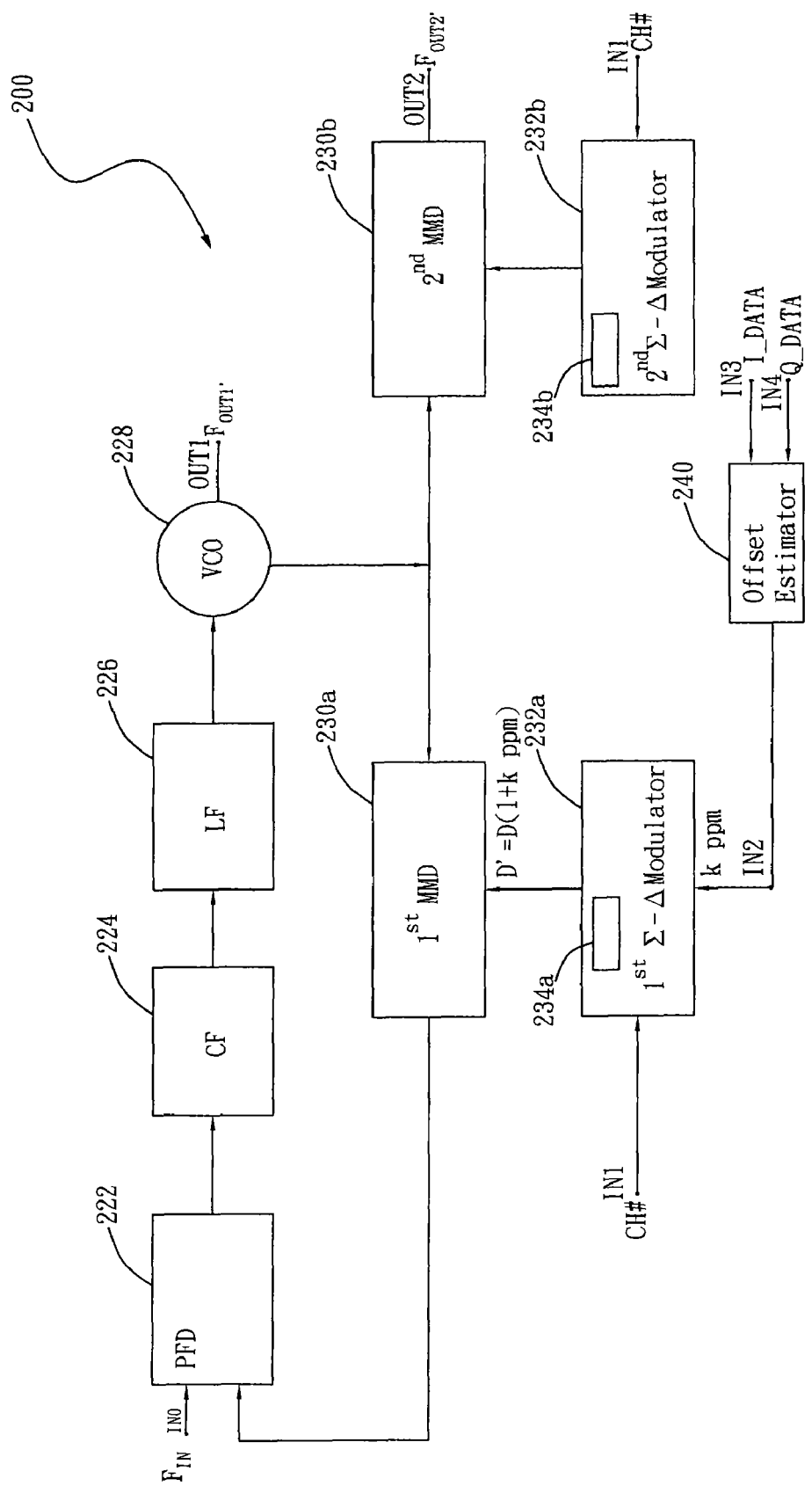
FIG. 2 shows a function block diagram of a frequency synthesizer in accordance with the present invention.

Please refer to FIG. 2, the frequency synthesizer 200 comprises a phase frequency detector 222, a charge pump 224, a loop filter 226, a voltage-controlled oscillator 228, a first multi-modulus divider 230a, a second multi-modulus divider 230b, a first sigma delta (Σ-Δ) modulator 232a and a second Σ-Δ modulator 234a. The frequency synthesizer 200 may also be read as a phase locked loop (PLL) with a calibrated divisor provided by the first Σ-Δ modulator 232a, which receives a first signal and further comprises the second multi-modulus divider 230b, and the second sigma delta modulator 234a. The latter two will not be operated until the PLL circuit has been run in the frequency locked state. The frequency synthesizer 200 outputs a calibrated crystal oscillation frequency FOUT2'=Xal'. The apostrophe appended on the Xal is to represent the frequency is not an original frequency of a crystal oscillator but includes a calibrated factor already.

In FIG. 2, the phase frequency detector 222 has a first input terminal IN0 to receive a signal FIN, which is the original crystal oscillation frequency Xal at the local and the second input terminal is fed by an output signal of the first multi-modulus divider 230a. The phase frequency detector 222 compares the two and then outputs accordingly a signal to the charger pump 224. The charger pump 224 then outputs a signal to the loop filter 226 and then the latter 226 outputs a resulted voltage to the voltage-controlled oscillator (VCO) 228. The oscillation frequency FOUT1 outputted from the output terminal OUT1 is further fed back to the first multi-modulus divider 230a and the second multi-modulus divider 230b.

The first Σ-Δ modulator 232a has a first look-up table 234a, which is a hardware providing one channel information or called channel number CH# mapping onto a predetermined divisor. The first Σ-Δ modulator 232a has two input terminals IN1, IN2. The input terminal IN1 receives a radio frequency and accordingly picks up the channel information CH#. The input terminal IN2 receives a frequency offset k in a unit of ppm (parts per million). from an offset estimation unit 240. Accordingly, the look-up table 234a generates a divisor D.

The divisor D may be just an integer I only or an integer with a fractional "I.f". For example, the look-up table 234a may output a predetermined divisor of 153 if a radio frequency received is transmitted through a channel number 21 or of 153.5 if it is through a channel number 20 according to the look-up table 234a.

The second input terminal IN2 of the first Σ-Δ modulator 232a is provided for receiving an offset expressed by k ppm. The offset will reflect on the divisor D to get a calibrated divisor D'. For example, the offset is of 1 ppm and the divisor D is of 153 and then the output of the first Σ-Δ modulator 232a will be D'=153.000153, where D'=D (1+k ppm).

Similarly, if the signal transmitted is through CH number 21 then the divisor is 153.5. 1 ppm of 153.5 will make "D'=153.5001535". The first Σ-Δ modulator 232a will demand a higher resolution in the output than that of the second Σ-Δ modulator 232b since aside from the first look-up table, it depends on the offset too.

The offset value is provided by offset estimated unit 240, which derives an offset value in accordance with the I_DATA (in-phase signal) and Q_DATA (quad signal) received by terminal IN3 and IN4. The detailed description is disclosed in the patent application NO. 0981334853 of Taiwan.

The first Σ-Δ modulator 232a outputs a calibrated divisor D' to the first multi-modulus divider 230a. Accordingly, the output of the first multi-modulus divider 230a is the signal frequency FOUT1' divided by the calibrated divisor D'. The frequency represented by the quotient is then compared with the signal FIN. When the phase difference between two signals is over ±2π, the phase frequency detector 222 is operated in a detected mode and the charge pump 224 runs at full speed until the phase difference within ±2π, when the phase frequency detector 222 is operated in a phase detection mode. The voltage output of the charge pump 224 is proportional to the phase difference. Once the difference reaches zero, the PLL runs into a phase locked state. Thereafter, the second multi-modulus divider 230b and the second Σ-Δ modulator 232b start to work.

Firstly, the second Σ-Δ modulator 232b with its input terminal IN1 receives the first signal. Consequently, the second look-up table 232b of the second Σ-Δ modulator 232b outputs a divisor D=153 corresponding to the channel information of the first signal, which is CH number of 20. For an original crystal oscillator of 16 $MH_z$, then a frequency outputted $F_{OUT1'}$ by the VCO 228 upon in the phase-locked-state is thus:

16 MHz×153.000153=2448.002448 MHz (1 ppm frequency offset gives the same variation 1 ppm at the output terminal.

The frequency 2448.002448 MHz divided by the divisor D=153 will get quotient $F_{OUT2}'$=16.000016 MHz, the same variation too. The hardware of the second Σ-Δ modulator 232b is simpler than that of the first Σ-Δ modulator 232a since it does not involve the offset issue.

The benefits of the present invention are:

The crystal oscillation frequency and carrier frequency outputted by the frequency synthesizers at the local and the distant according to the present invention are calibrated and thus is in consistence. The positioning precision reaches 1 ppm level thus the transceiver will give accurate and reliable results if it has the forgoing frequency synthesizer.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A frequency synthesizer of a transceiver for generating a calibrated crystal oscillation frequency and a calibrated carry frequency, in accordance with a wireless signal received, comprising:
    a phase frequency detector having a first input terminal to receive a crystal oscillation frequency $F_{IN}$;
    a charge pump connected to an output terminal of said phase frequency detector;
    a loop filter connected to an output terminal of said charge pump;
    a VCO (voltage-controlled oscillator) connected to an output terminal of said loop filter and having a first output terminal to output a frequency-locked signal $F_{OUT1'}$;
    a first multi-modulus divider connected to said VCO and outputting a signal to a second input terminal of said phase frequency detector;
    a first Σ-Δ modulator having a second input terminal, a third input terminal, and an output terminal, wherein said second input terminal is to receive a channel information of said wireless signal, thereby a predetermined first divisor D is determined, and said third input terminal is to receive a frequency offset value represented by a "k" in a unit of ppm (parts per million) k, and said output terminal of said first Σ-Δ modulator is to output a first calibrated divisor D' to an input terminal of said first multi-modulus divider, according to an equation D'=D (1+k ppm);
    a second multi-modulus divider connected to said VCO and having a second output terminal of said frequency synthesizer to generate said calibrated crystal oscillation frequency while said frequency synthesizer runs into a phase locked mode; and
    a second Σ-Δ modulator having an input terminal to receive said channel information of said wireless signal, and an output terminal connected to said second multi-modulus divider to provide said predetermined first divisor D according to said channel information.

2. The frequency synthesizer according to claim 1 further comprising a frequency offset estimation unit to receive an imaginary part and a real part of said wireless signal thereto generate said frequency offset k.

3. The frequency synthesizer according to claim 1 wherein said first Σ-Δ modulator comprises a first look-up table, which provides each channel information mapping onto a predetermined divisor.

4. The frequency synthesizer according to claim 1 wherein said second Σ-Δ modulator comprises a second look-up table, which provides each channel information mapping onto a predetermined divisor.

5. The frequency synthesizer according to claim 1 wherein said frequency-locked signal is a signal having a frequency $F_{OUT1'}$ where $F_{OUT1'}=F_{IN}×D'$ while said frequency synthesizer is running into a phase locked mode.

6. The frequency synthesizer according to claim 5 wherein said calibrated crystal oscillation frequency $F_{OUT2'}$ satisfy an equation of $F_{OUT2'}=F_{OUT1'}/D$.

* * * * *